(12) United States Patent
Polak et al.

(10) Patent No.: US 11,486,954 B2
(45) Date of Patent: Nov. 1, 2022

(54) SYSTEMS AND METHODS FOR EXTENDING RECONSTRUCTIONS TO NON-UNIFORM K-SPACE SAMPLING

(71) Applicants: Siemens Healthcare GmbH, Erlangen (DE); The General Hospital Corporation, Boston, MA (US)

(72) Inventors: Daniel Polak, Blankenbach (DE); Stephen Farman Cauley, Somerville, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 17/000,827

(22) Filed: Aug. 24, 2020

(65) Prior Publication Data
US 2022/0057468 A1 Feb. 24, 2022

(51) Int. Cl.
| | | |
|---|---|---|
| G01R 33/58 | (2006.01) |
| G01R 33/48 | (2006.01) |
| G01R 33/32 | (2006.01) |
| G01R 33/385 | (2006.01) |
| G01R 33/56 | (2006.01) |

(52) U.S. Cl.
CPC ............ *G01R 33/58* (2013.01); *G01R 33/32* (2013.01); *G01R 33/385* (2013.01); *G01R 33/4818* (2013.01); *G01R 33/5608* (2013.01)

(58) Field of Classification Search
CPC .... G01R 33/58; G01R 33/32; G01R 33/4818; G01R 33/5608; G01R 33/385
See application file for complete search history.

(56) References Cited

U.S. PATENT DOCUMENTS

| | | | | |
|---|---|---|---|---|
| 8,638,096 B2 * | 1/2014 | Zhang | ............... | G01R 33/5611 324/309 |
| 10,408,910 B2 | 9/2019 | Cauley et al. | | |
| 2007/0182412 A1 * | 8/2007 | Katscher | ............ | G01R 33/5611 324/309 |
| 2008/0012562 A1 * | 1/2008 | Beatty | ............... | G01R 33/5611 324/307 |
| 2008/0197844 A1 * | 8/2008 | Ying | .................. | G01R 33/5611 324/309 |

(Continued)

OTHER PUBLICATIONS

Breuer et al., "Controlled Aliasing in Volumetric Parallel Imaging (2D CAIPIRINHA)," Magnetic Resonance in Medicine, vol. 55, No. 3, pp. 549-556 (2006).

(Continued)

*Primary Examiner* — G. M. A Hyder
(74) *Attorney, Agent, or Firm* — Banner & Witcoff Ltd.

(57) ABSTRACT

In a medical imaging auto-calibrated reconstruction method, an imaging scan is performed using a data acquisition scanner to generate image data, calibration data having a uniform sampling is determined, a point-spread function is determined based on the calibration data, and an image is reconstructed from the image data based on the point-spread function. A central region of k-space may have uniform sampling. The calibration data may be determined by extracting a uniformly-sampled central region of k-space from the image data. An outer region of k-space may have non-uniform sampling. A calibration scan may be performed to generate the calibration data.

20 Claims, 6 Drawing Sheets

(56) References Cited

U.S. PATENT DOCUMENTS

| | | | | |
|---|---|---|---|---|
| 2011/0241677 A1* | 10/2011 | Busse | ............ | G01R 33/56308 324/309 |
| 2016/0132746 A1* | 5/2016 | Saranathan | ........ | G01R 33/4818 382/131 |
| 2017/0097403 A1* | 4/2017 | Cauley | ............... | G01R 33/4818 |
| 2018/0143277 A1* | 5/2018 | Chen | ................. | G01R 33/5611 324/309 |

OTHER PUBLICATIONS

Lustig et al., "Sparse MRI: The Application of Compressed Sensing for Rapid MR Imaging," Magnetic Resonance in Medicine, vol. 58, No. 6, pp. 1182-1195 (2007).

Bilgic et al., "Wave-CAIPI for Highly Accelerated 3D Imaging," Magnetic Resonance in Medicine, vol. 73, No. 6, pp. 2152-2162 (2015).

Schwarz et al., "GRAPPA reconstructed wave-CAIPI MP-RAGE at 7 Tesla," Magnetic Resonance in Medicine, vol. 80, No. 6, pp. 2427-2438 (2018).

Cauley et al., "Autocalibrated Wave-CAIPI Reconstruction; Joint Optimization of k-Space Trajectory and Parallel Imaging Reconstruction," Magnetic Resonance in Medicine, vol. 78, pp. 1093-1099 (2017).

Polak et al., "Highly-Accelerated Volumetric Brain Examination Using Optimized Wave-CAIPI Encoding," Journal of Magnetic Resonance Imaging, vol. 50, No. 3, pp. 961-974 (2019).

Polak et al., "Wave-CAIPI for Highly Accelerated MP-RAGE Imaging," Magnetic Resonance in Medicine, vol. 79, No. 1, pp. 401-406 (2018).

Haskell et al., "Targeted Motion Estimation and Reduction (TAMER): Data Consistency Based Motion Mitigation for MRI using a Reduced Model Joint Optimization," IEEE Trans Med Imaging, 37(5), pp. 1253-1265 (2018).

* cited by examiner

SYSTEMS AND METHODS FOR EXTENDING RECONSTRUCTIONS TO NON-UNIFORM K-SPACE SAMPLING

BACKGROUND

Field

Embodiments described herein generally relate to medical imaging systems and methods, including auto-calibrated reconstruction techniques for non-uniform k-space sampling.

Related Art

Parallel imaging is widely used to accelerate magnetic resonance imaging (MRI) scans. However, to avoid artifacts and large g-factor noise amplification, clinical application are limited to moderate acceleration techniques.

To enable higher acceleration, advanced encoding techniques have been developed. Examples of these encoding techniques include: (1) Controlled Aliasing In Parallel Imaging Results IN Higher Acceleration (CAIPIRINHA), as described in F. A. Breuer et al., "Controlled aliasing in volumetric parallel imaging (2D CAIPIRINHA)," Magn. Reson. Med., vol. 55, no. 3, pp. 549-556, 2006; (2) Compressed Sensing, as described in M. Lustig, D. Donoho, and J. M. Pauly, "Sparse MRI: The application of compressed sensing for rapid MR imaging," Magn. Reson. Med., vol. 58, no. 6, pp. 1182-1195, 2007; and (3) Wave-CAIPI (controlled aliasing in parallel imaging) as described in B. Bilgic et al., "Wave-CAIPI for highly accelerated 3D imaging," Magn. Reson. Med., vol. 73, no. 6, pp. 2152-2162, 2015. These techniques provide better encoding capability, yielding higher quality reconstructions. Each of these documents (1)-(3) are incorporated herein by reference in its entirety.

Wave-CAIPI employs sinusoidal gradients during the readout to spread aliasing artifacts across all three spatial dimensions. This allows Wave-CAIPI to exploit variations in the coil sensitivity profile along all three-dimensional, enabling better reconstruction performance. However, Wave-CAIPI requires knowledge of the exact Wave k-space trajectory. This information is typically included in the Wave point spread function (PSF), which is used in the reconstruction. In practice, gradient imperfections may cause slight deviations from the nominal sinusoidal gradient trajectory. Neglecting such deviations in the reconstruction may lead to artifacts.

Several approaches have been proposed to estimate imperfections of the Wave gradient trajectory. Examples of these approaches include: (1) using field cameras to directly measure the gradient trajectory, as described in J. M. Schwarz, E. D. Pracht, D. Brenner, M. Reuter, and T. Stocker, "GRAPPA reconstructed wave-CAIPI MP-RAGE at 7 Tesla," Magn. Reson. Med., vol. 80, no. 6, pp. 2427-2438, 2018; (2) performing additional calibration scans to measure the PSF, as described in Wave-CAIPI (controlled aliasing in parallel imaging) as described in B. Bilgic et al., "Wave-CAIPI for highly accelerated 3D imaging," Magn. Reson. Med., vol. 73, no. 6, pp. 2152-2162, 2015; and (3) estimating the Wave k-space trajectory using an auto-calibrated reconstruction approach (e.g. AutoPSF), which jointly optimizes for the Wave's k-space trajectory and the collapsing voxels x, S. F. Cauley, K. Setsompop, B. Bilgic, H. Bhat, B. Gagoski, and L. L. Wald, "Autocalibrated wave-CAIPI reconstruction; Joint optimization of k-space trajectory and parallel imaging reconstruction," Magn. Reson. Med., vol. 78, no. 3, pp. 1093-1099, 2017. Each of these documents (1)-(3) are incorporated herein by reference in its entirety.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 schematically illustrates an example of a magnetic resonance apparatus.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Figure 1:
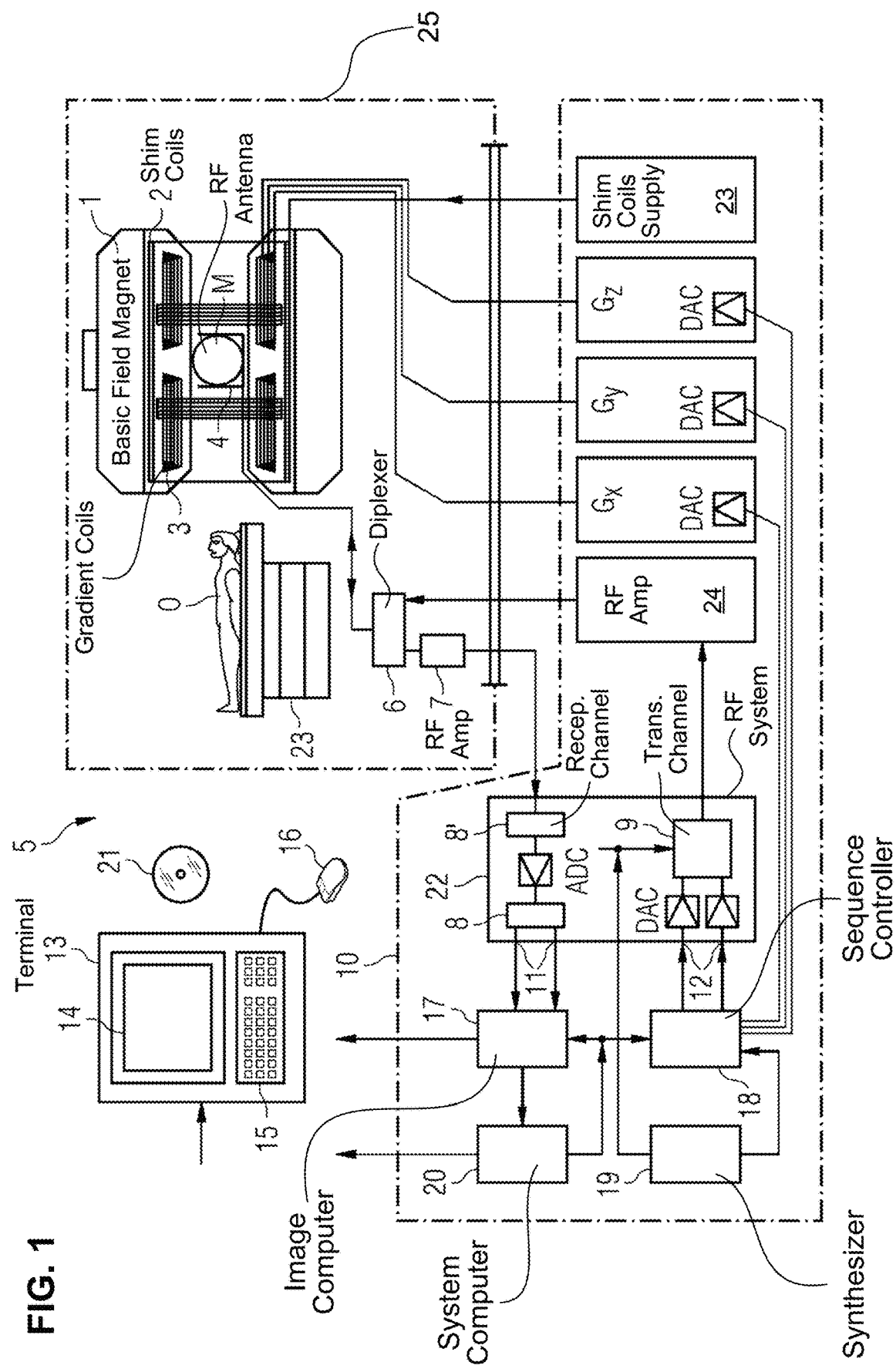

FIG. 1 schematically illustrates an example of a magnetic resonance apparatus 5 (a magnetic resonance imaging or tomography device). The magnetic resonance (MR) apparatus 5 includes a controller 10 that is configured to control a MR data acquisition scanner 25 of the apparatus 5 and process data and/or information generated by the MR data acquisition scanner 25. In an exemplary embodiment, the controller 10 and/or the MR data acquisition scanner 25 includes processor circuitry that is configured to perform the respective operations of the controller 10 and MR data acquisition scanner 25. Further, one or more including one or more respective components of the controller 110 and/or the MR data acquisition scanner 25 may include processor circuitry configured to perform the respective operations of those component(s).

In operation, a basic field magnet 1 of the scanner 25 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate controller 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 can include a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the processing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 (of the controller 10) furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored on a memory or other recording medium 21, for example, on a DVD or other memory, as well as other user inputs such as a desired number n of adjacent clusters, which are to collectively cover the desired k-space, and the display of the generated MR images, occurs via a terminal 13, which includes one or more input interfaces for enabling input entries, such as, e.g. a keyboard 15, and/or a mouse 16, and one or more output interfaces for enabling a display, such as, e.g. a display screen. The components within the dot-dash outline S are commonly called a magnetic resonance scanner.

The magnetic resonance apparatus 5 may be configured to perform the methods for enabling acquisitions with arbitrary k-space sampling according to exemplary embodiments of the present disclosure. In an exemplary embodiment, the controller 10 is configured to control the MR scanner 25 to perform the reconstruction processes/methods as described with reference to FIGS. 3-6.

As described above, an auto-calibrated reconstruction approach, such as AutoPSF, can be used to estimate the Wave k-space trajectory for wave-CAIPI systems. Conventionally, Wave-CAIPI is limited to data with uniform sampling (e.g. uniformly-spaced samplings). Wave-CAIPI is described in, for example: (1) B. Bilgic et al., "Wave-CAIPI for highly accelerated 3D imaging," Magn. Reson. Med., vol. 73, no. 6, pp. 2152-2162, 2015; (2) D. Polak et al., "Highly-accelerated volumetric brain examination using optimized wave-CAIPI encoding," J. Magn. Reson. Imaging, vol. 50, no. 3, pp. 961-974, 2019; and (3) D. Polak et al., "Wave-CAIPI for highly accelerated MP-RAGE imaging," Magn. Reson. Med., vol. 79, no. 1, pp. 401-406, 2018. Each of these documents (1)-(3) are incorporated herein by reference in its entirety.

In conventional Wave-CAIPI, the resulting encoding matrix is sparse in image space, which allows the parallel imaging reconstruction to be split into smaller sub-problems of collapsing voxels in image space. For example, at R=2×2 acceleration, the generalized SENSE reconstruction for Wave-CAIPI may be reduced to only four collapsing readout lines. AutoPSF leverages this property when estimating the Wave gradient trajectory. In particular, AutoPSF limits the non-linear optimization to a few representative groups of collapsing voxels in image and thus dramatically increases the convergence/efficiency of the optimization. This has enabled online reconstruction of Wave-CAIPI datasets, where the estimation of the Wave trajectory takes only 10 sec using conventional scanner hardware. Non-uniform k-space sampling typically couples the entire three-dimensional (3D) image space into the parallel imaging problem. This dramatically reduces the efficiency of AutoPSF because the non-linear trajectory optimization cannot be limited to a small subset of presentative voxels. Rather, the optimization must be performed across the entire 3D dataset, which is computationally demanding and very time-consuming.

According to aspects of the present disclosure, the auto-calibrated Wave-CAIPI reconstruction approach is extended to non-uniform k-space sampling to expand the use of AutoPSF to acquisitions with arbitrary k-space sampling (e.g., non-uniform sampling).

In exemplary embodiments of the present disclosure, auto-calibrated Wave-CAIPI reconstructions of non-uniform k-space sampling may be implemented either in the imaging sequence itself or as part of a separate, fast calibration scan. In these embodiments, a uniformly-sampled calibration region is acquired (e.g. at low spatial resolution). This advantageously enables efficient estimation of the exact Wave k-space trajectory even with non-uniform k-space samplings outside of the calibration region.

The present disclosure is not limited to Wave-CAIPI reconstructions and other reconstruction techniques can be used as would be understood by one of ordinary skill in the art. For example, the disclosure is not limited sinusoidal gradients as used in Wave-CAIPI, and the aspects described herein are also applicable to other techniques using arbitrary gradient shapes in which the gradient shape is constant for the acquisition of the different ky/kz positions (e.g. instead of playing sine and cosine on the Gy and Gz gradient, it is possible to play, for example, a zig-zag trajectory).

Imaging Sequence Adapted for Uniform Sampling

Figure 2B:
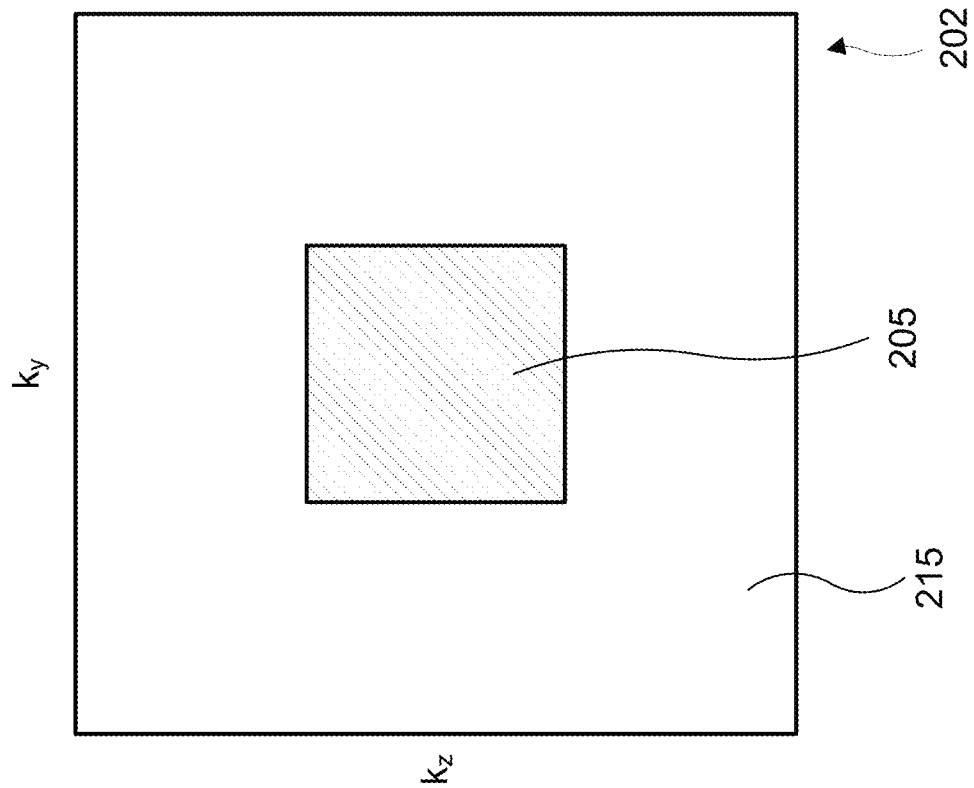
FIG. 2B illustrates a k-space representation of calibration data according to an exemplary embodiment of the present disclosure.
Figure 2A:
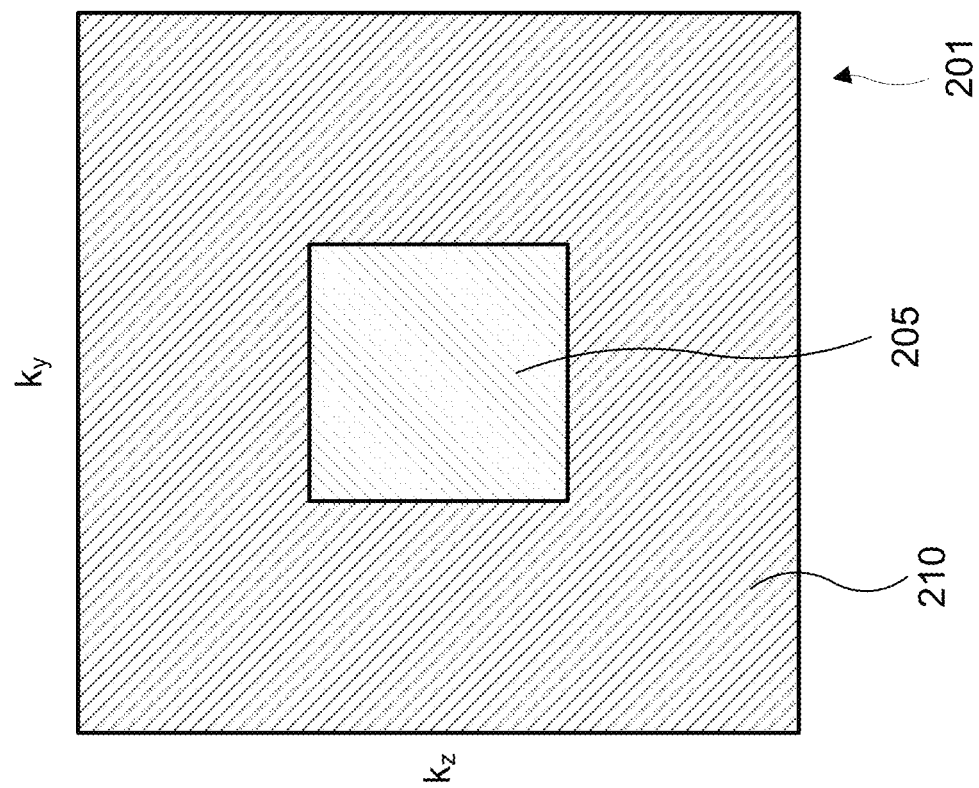
FIG. 2A illustrates a k-space representation of image data according to an exemplary embodiment of the present disclosure.

In an exemplary embodiment, with reference to FIG. 2A, to expand auto-calibrated reconstruction techniques (e.g. AutoPSF) to non-uniform k-space sampling, the imaging sequence with Wave-encoding is adapted (as shown in k-space 201) to accommodate uniform sampling in the central calibration region 205 (with or without under-sampling), while non-uniform sampling may be employed for the remaining portion of k-space 210. That is, the image scan is configured so that the central region 205 of k-space 201 has uniform sampling while the other, outer region 210 of k-space may be non-uniformly sampled. By adapting the data acquisition to have a uniform sampling in the central region 205, a low spatial resolution scan (e.g. 202 in FIG. 2B) can be obtained from the image scan by extracting the uniformly sampled k-space central region 205 from the image scan. In this example, the data in the outer region 210 (the non-uniformly sampled portion) is set to zero to generate a low spatial resolution calibration scan 202. AutoPSF can then be performed on the low spatial resolution calibration scan 202 to obtain the point-spread function (PSF). The PSF is then used to reconstruct the image from the k-space 201 of the image scan.

Figure 3:
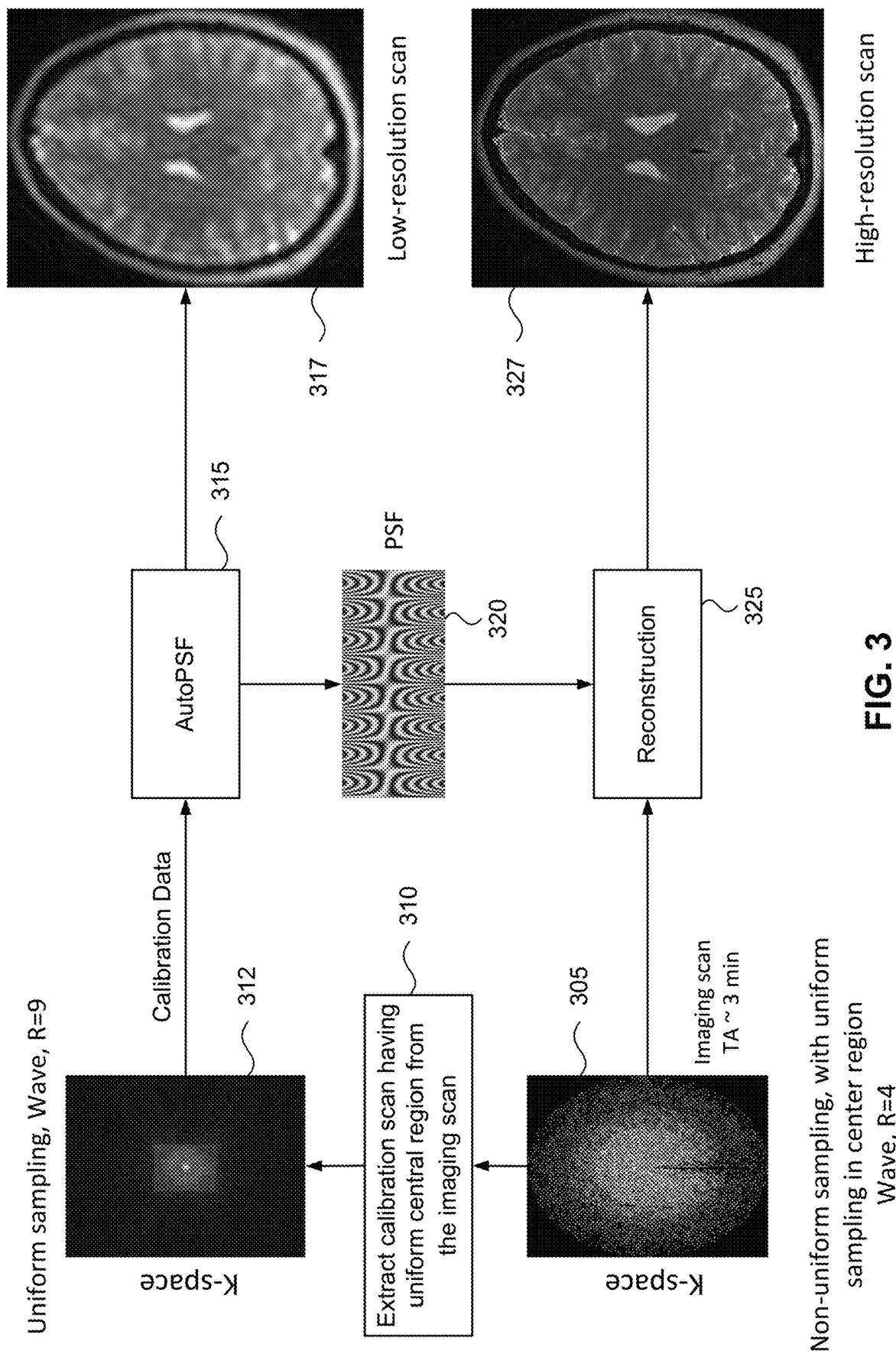
FIGS. 3 and 4 illustrates corresponding reconstruction processes and methods according to an exemplary embodiment of the present disclosure.
Figure 4:
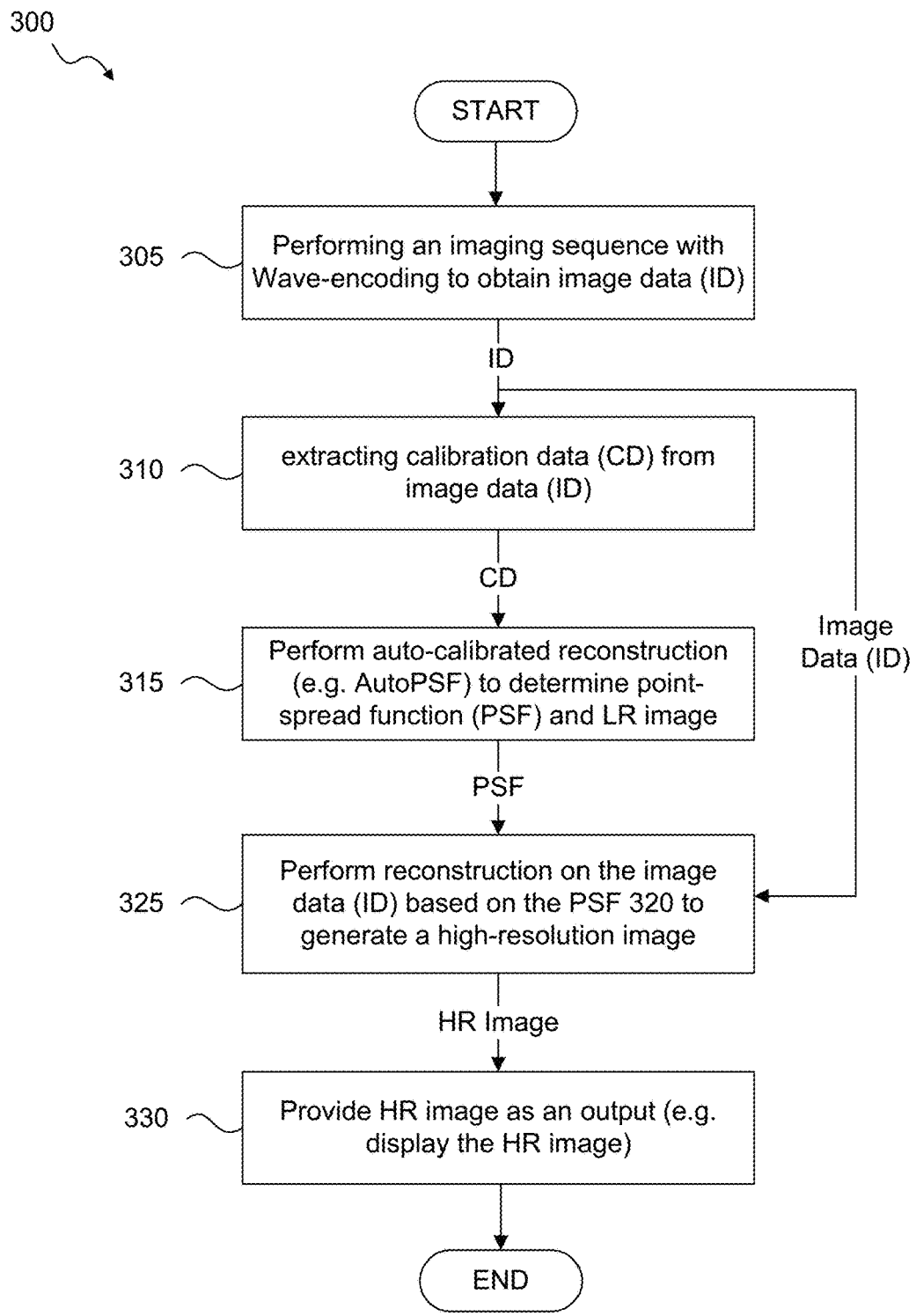

A reconstruction method according to an exemplary embodiment is described with reference to FIGS. 3 and 4. FIG. 3 shows a reconstruction process and FIG. 4 shows a corresponding flowchart 300 of a reconstruction method.

In an exemplary embodiment, an imaging sequence with Wave-encoding is performed at operation 305 to perform an imaging scan that generates image data (e.g. k-space 201). The imaging scan is configured so that the central region 205 of k-space 201 has uniform sampling while the other, outer region 210 of k-space 201 can be non-uniformly sampled. In an exemplary embodiment, the controller 10 is configured to control the MR scanner 25 to obtain image data from the object under examination O, and to process the image data to generate k-space 201.

From the image data represented in k-space 201 acquired by the image scan, calibration data (i.e. k-space 202) is extracted at operation 310 to generate low spatial resolution calibration data 312 (as represented by k-space 202). In an exemplary embodiment, the extraction includes setting the data in the outer region 210 (the non-uniformly sampled portion) to zero to generate the low spatial resolution calibration data (as represented by k-space 202). In an exemplary embodiment, the controller 10 is configured to generate (e.g. extract) the calibration data (k-space 202) based on the image data (k-space 201) obtained from the imaging sequence.

At operation 315, an auto-calibrated reconstruction is performed to estimate the Wave k-space trajectory and determine the point-spread function (PSF) 320. The auto-calibrated reconstruction also generates a low-resolution image 317. In operation, the auto-calibrated reconstruction (e.g. AutoPSF) performs an alternating optimization over the PSF and the low-resolution image to ultimately generate the true PSF 320 and the low-resolution image 317. In an exemplary embodiment, the controller 10 is configured to perform the auto-calibrated reconstruction based on the low spatial resolution calibration data 312 (as represented by k-space 202) to generate the low-resolution image 317 and determine the PSF 320.

In an exemplary embodiment, the known auto-calibrated reconstruction referred to as AutoPSF is used, which jointly optimizes for the Wave's k-space trajectory and the collapsing voxels x. AutoPSF is described in, for example, "*Auto-calibrated wave-CAIPI reconstruction; Joint optimization of k-space trajectory and parallel imaging reconstruction,*" S. F. Cauley, K. Setsompop, B. Bilgic, H. Bhat, B. Gagoski, and L. L. Wald, Magn. Reson. Med., vol. 78, no. 3, pp. 1093-1099, 2017, which is incorporated herein by reference in its entirety. The present disclosure is not limited to AutoPSF and one or more other auto-calibrated reconstructions can be used as would be understood by one of ordinary skill in the art.

At operation 325, reconstruction is performed on the image data (e.g. k-space 201) from the imaging scan performed at operation 305 and the PSF 320 to generate a high-resolution image 327. In an exemplary embodiment, the controller 10 is configured to perform the reconstruction 325 on the image data (e.g. k-space 201) based on the PSF 320 to generate the high-resolution image 327. In an exemplary embodiment, the reconstruction includes an optimization over high-resolution image 327 while the PSF 320 is fixed.

The image reconstruction process may utilize any reconstruction technique as would be understood by one of ordinary skill in the art. For example, the image reconstruction process can use one or more reconstruction techniques as described in "*Wave-CAIPI for highly accelerated 3D imaging,*" B. Bilgic et al., Magn. Reson. Med., vol. 73, no. 6, pp. 2152-2162, 2015, which is incorporated herein by reference in its entirety. These techniques provide better encoding capability, yielding higher quality reconstructions while allowing for image data with non-uniform sampling (e.g. k-space 201). That is, the high-resolution image 327 generated by the inventive method illustrated in FIGS. 3 and 4 extends, for example, the auto-calibrated Wave-CAIPI reconstruction approach to non-uniform k-space sampling (e.g. k-space 201) to expand the use of AutoPSF to acquisitions with arbitrary k-space sampling (e.g., non-uniform sampling). This advantageously enables efficient estimation of the exact Wave k-space trajectory even in non-uniform k-space samplings. It is further advantageous to use non-uniform samplings because the non-uniformities of such samplings advantageously reduce artifacts. For example, artifacts resulting from such non-uninform based reconstructions can be more easily identified and removed because the non-uniform sampling results in more noise-like (incoherent) artifacts that are more easily filtered out of the resulting high-resolution image.

In an exemplary embodiment, the high-resolution image (HR image) can be output (operation 330) by the controller 10 as an electronic output signal, displayed (e.g. on display 14 of terminal 13), stored in memory (e.g. in memory 21), or further processed as would be understood by one of ordinary skill in the art. After operation 330, the flowchart 300 can end. The flowchart 300 can be repeated for one or more additional imaging scans.

Low-Resolution Calibration Scan with Uniform Sampling

Figure 5:
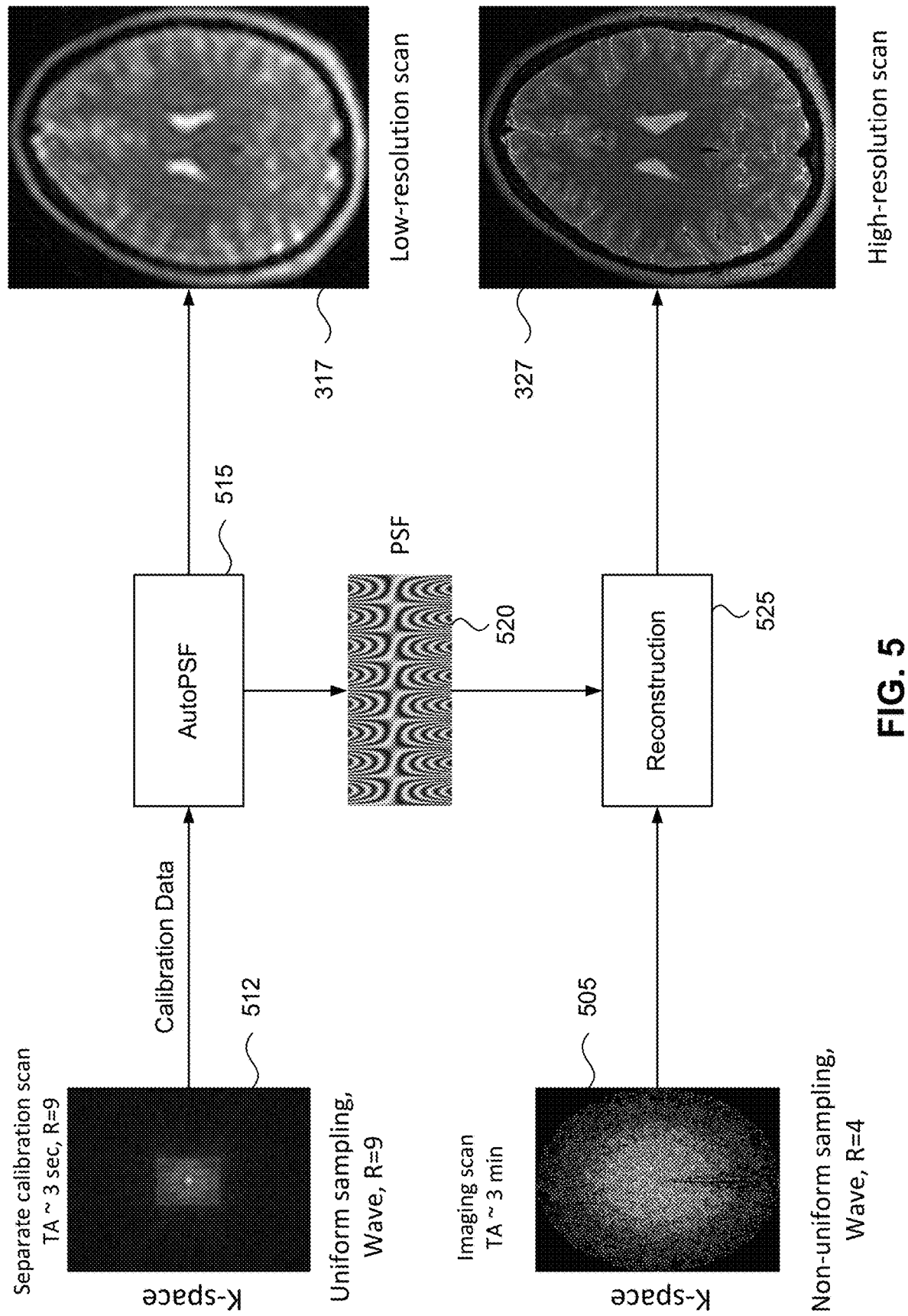
FIGS. 5 and 6 illustrates corresponding reconstruction processes and methods according to an exemplary embodiment of the present disclosure.

In another exemplary embodiment to expand auto-calibrated reconstruction techniques (e.g. AutoPSF) to non-uniform k-space sampling, with reference to FIG. 2B, instead of adapting the imaging sequence to include a uniformly sampling center region 205 in k-space 201, a separate low spatial resolution calibration scan 512 (FIG. 5) with Wave-encoding and uniform sampling (with or without under-sampling) is performed to obtain calibration data (k-space 202). In this example, the imaging sequence can include k-space sampling that is entirely non-uniform because calibration data (k-space 202 having uniform sampling in central region 205) is obtained from the separate low spatial resolution calibration scan 512 (FIG. 5). The PSF 520 is then determined from the calibration data generated from the calibration scan 512, where the PSF 520 is then used for the later reconstruction, as described in more detail below.

Returning to FIG. 2B, the calibration data from the low spatial resolution calibration scan 512 (FIG. 5) has a central calibration region 205 of k-space with uniform sampling. Sampling in the remaining regions of k-space 215 is omitted. In an exemplary embodiment, at high acceleration, the calibration scan 512 is very rapid and can be inserted before or after the imaging sequence. The calibration scan 512 may also replace dummy shots, which are often acquired at the beginning of imaging sequences to reach a steady state magnetization. This advantageously allows further scan time reduction.

Figure 6:
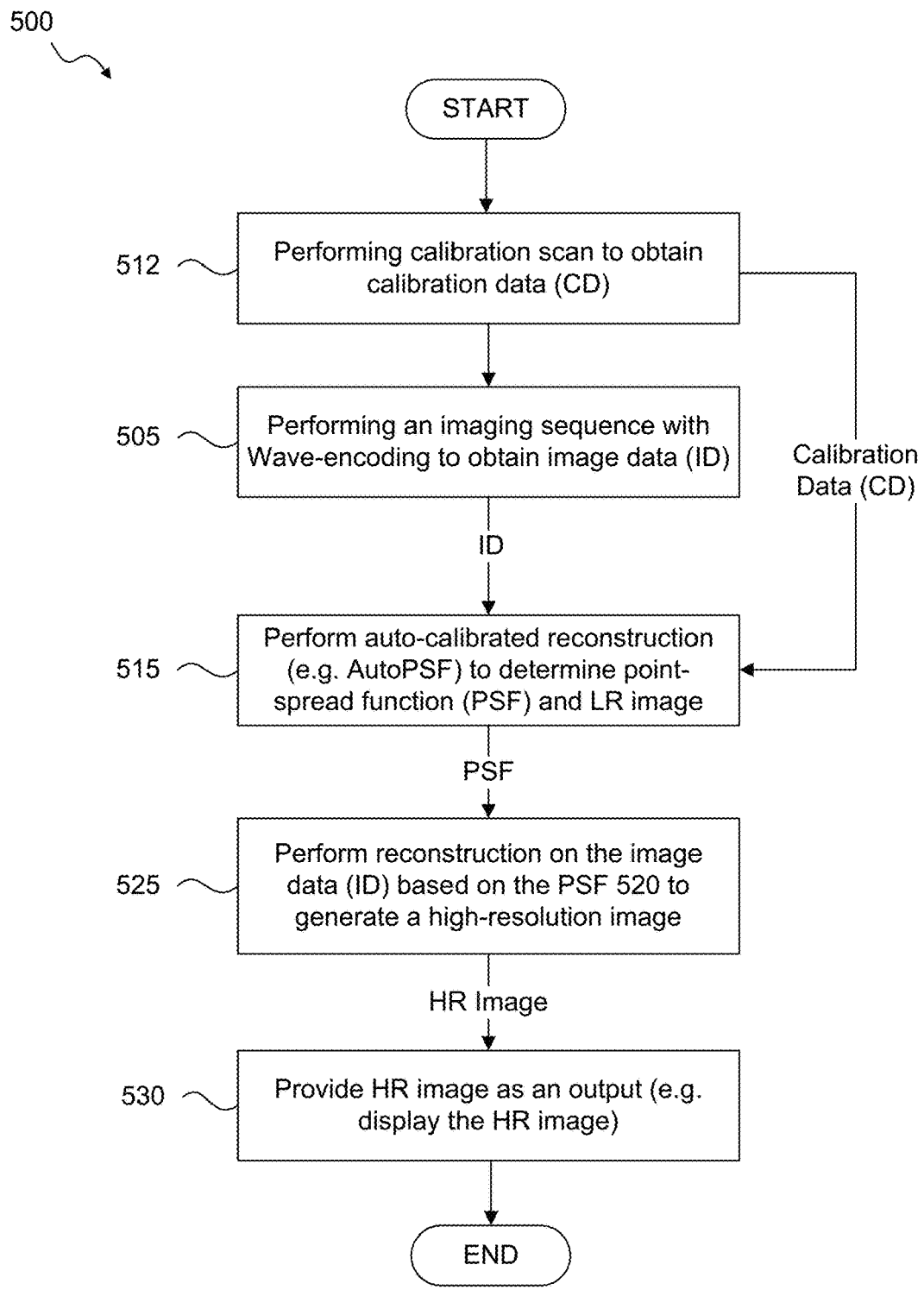

A reconstruction method according to an exemplary embodiment is described with reference to FIGS. 5 and 6. FIG. 5 shows a reconstruction process similar to the process illustrated in FIG. 3 and FIG. 6 shows a corresponding flowchart 600 of a reconstruction method similar to the flowchart 300 of FIG. 4. The reconstruction process in FIG. 5 is similar to the reconstruction process in FIG. 3, and common operations are reflected with the similar reference numbers as in FIG. 3 (e.g. 515 and 315). Similarly, the flowchart 600 in FIG. 6 is similar to the flowchart 300 of FIG. 4, and common operations are reflected with similar reference numbers as in FIG. 4. Discussion of these common operations may be omitted for brevity.

In an exemplary embodiment, imaging sequence with Wave-encoding is performed at operation 505 to perform an imaging scan to generate image data. This operation is similar to 305, but it is not restricted to having a region (e.g. central region) of k-space (e.g. region 205 of k-space 201) with uniform sampling. That is, the imaging sequence can include k-space sampling that is entirely non-uniform because uniformly-sampled calibration data (k-space 202) is obtained from the separate low spatial resolution calibration scan 512 (FIG. 5). In an exemplary embodiment, the controller 10 is configured to control the MR scanner 25 to obtain image data from the object under examination O, and to process the image data.

At operation 512, a separate low spatial resolution calibration scan 512 (FIG. 5) with Wave-encoding and uniform sampling (with or without under-sampling) is performed to obtain calibration data (k-space 202).

The PSF 520 is then determined from the calibration data generated from the calibration scan 512 at operation 515. In an exemplary embodiment, an auto-calibrated reconstruction is performed to estimate the Wave k-space trajectory and determine the point-spread function (PSF) 520. The auto-calibrated reconstruction also generates a low-resolution image 517 as in the process shown in FIG. 3. In operation, the auto-calibrated reconstruction (e.g. AutoPSF) performs an alternating optimization over the PSF and the low-resolution image to ultimately generate the true PSF 520 and the low-resolution image 517. In an exemplary embodiment, the controller 10 is configured to perform the auto-calibrated reconstruction based on the low spatial resolution calibration data 512 (as represented by k-space 202) to generate the low-resolution image 517 and determine the PSF 520.

At operation 525, as similarly described above, reconstruction is performed on the image data from the imaging scan performed at operation 505 and the PSF 520 to generate a high-resolution image 527. In an exemplary embodiment, the controller 10 is configured to perform the reconstruction 525 on the image data (e.g. k-space 201) based on the PSF 520 to generate the high-resolution image 527. The image reconstruction process can utilize any reconstruction technique as would be understood by one of ordinary skill in the art. According to exemplary embodiments of the present disclosure, the reconstruction techniques provide better encoding capability, yielding higher quality reconstructions while allowing for image data with non-uniform sampling (e.g. k-space 201). That is, the high-resolution image 527 generated by the inventive method illustrated in FIGS. 5 and 6 extends, for example, the auto-calibrated Wave-CAIPI reconstruction approach to non-uniform k-space sampling to expand the use of AutoPSF to acquisitions with arbitrary k-space sampling (e.g., non-uniform sampling). This advantageously enables efficient estimation of the exact Wave k-space trajectory even in non-uniform k-space samplings. It is further advantageous to use non-uniform samplings because the non-uniformities of such samplings advantageously reduce artifacts. For example, artifacts resulting from such non-uniform based reconstructions can be more easily identified and removed because the non-uniform sampling results in more noise-like (incoherent) artifacts that are more easily filtered out of the resulting high-resolution image.

As shown in FIG. 6, the calibration scan 512 and the imaging sequence 505 are preformed sequentially. However, the calibration scan 505 can be a part of the imaging sequence 505. For example, the calibration scan 512 may replace dummy shots, which are often acquired at the beginning of the imaging sequence 505 to reach a steady state magnetization. This advantageously allows further scan time reduction. In another exemplary embodiment, the calibration scan 512 is performed after the imaging sequence 505.

In an exemplary embodiment, the high-resolution image (HR image) can be output (operation 530) by the controller 10 as an electronic output signal, displayed (e.g. on display 14 of terminal 13), stored in memory (e.g. in memory 21), or further processed as would be understood by one of ordinary skill in the art. After operation 330, the flowchart 300 can end. The flowchart 300 can be repeated for one or more additional imaging scans.

Aspects of the present disclosure that utilize wave-encoding with non-uniform sampling can advantageously serve several applications. For example, the aspects of the present disclosure can be applied to compressed sensing reconstructions with Wave-encoding. In this example, incoherent aliasing (non-uniform sampling) and sparsifying transforms (as in compressed sensing applications as described in "Sparse MRI: The application of compressed sensing for rapid MR imaging," M. Lustig, D. Donoho, and J. M. Pauly, Magn. Reson. Med., vol. 58, no. 6, pp. 1182-1195, 2007) can help to mitigate noise and parallel imaging artifacts. This may advantageously enable better image quality at high acceleration. Aspects can also be applied in prospective/retrospective motion correction with Wave-encoding. That is, the ability to estimate gradient trajectory errors using AutoPSF may be severely compromised when there is large subject motion. A fast calibration scan advantageously mitigates such issues as rapid scans are less likely to be affected by motion.

Wave-encoding may also be used in retrospective motion correction algorithms, such as in TArgeted Motion Estimation and Reduction (TAMER) techniques as described in, for example, M. W. Haskell, S. F. Cauley, and L. L. Wald, "TArgeted Motion Estimation and Reduction (TAMER): Data consistency based motion mitigation for MRI using a reduced model joint optimization," IEEE Trans. Med. Imaging, vol. 37, no. 5, pp. 1253-1265, 2018. This document is incorporated herein by reference in its entirety. These methods typically minimize the data-consistency error of the parallel imaging encoding model. However, this requires precise knowledge of the Wave PSF, which is advantageously provided as described in the present disclosure.

Exemplary aspects are also applicable for prospectively (on the fly) data-rejection, and allow re-acquisition of data in real-time to advantageously reduce or obviate the need for time-consuming retrospective motion correction.

Conclusion

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, a data processing circuit, a programmable processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A medical imaging auto-calibrated reconstruction method, comprising:
    performing an imaging scan using a data acquisition scanner to generate image data;
    obtaining calibration data having a uniform sampling with under-sampling;

determining a point-spread function based on the calibration data; and
reconstructing an image from the image data based on the point-spread function.

2. The method according to claim 1, wherein the imaging scan is configured such that a central region of k-space has uniform sampling, the obtaining of the calibration data including extracting a uniformly-sampled central region of k-space to generate the calibration data.

3. The method according to claim 2, wherein an outer region of k-space has non-uniform sampling.

4. The method according to claim 1, wherein the calibration data is based on the image data.

5. The method according to claim 1, wherein the imaging scan is configured such that at least a portion of k-space has non-uniform sampling.

6. The method according to claim 1, wherein obtaining the calibration data comprises performing a calibration scan using the data acquisition scanner to generate the calibration data.

7. The method according to claim 6, wherein k-space corresponding to the calibration data includes a central region having uniform sampling.

8. The method according to claim 7, wherein the calibration scan has a lower spatial resolution than the imaging scan.

9. The method according to claim 6, wherein the calibration scan has a lower spatial resolution than the imaging scan.

10. The method according to claim 6, wherein the imaging scan is configured such that an entirety of k-space has non-uniform sampling.

11. The method according to claim 1, wherein the imaging scan includes a Wave-CAIPI (controlled aliasing in parallel imaging) sequence.

12. The method according to claim 11, wherein the imaging scan is configured such that at least a portion of k-space has non-uniform sampling.

13. The method according to claim 11, wherein a central region of k-space has uniform sampling and an outer region of k-space has non-uniform sampling.

14. A non-transitory computer-readable storage medium with an executable program stored thereon, that when executed, instructs a processor to perform the method of claim 1.

15. A magnetic resonance (MR) imaging system configured for imaging of an examination object, the MR imaging system comprising:
a MR scanner configured to acquire image data from the examination object; and
a controller that is configured to:
control the MR scanner to perform an imaging scan to generate the image data;
determine calibration data having a uniform sampling with under-sampling;
determine a point-spread function based on the calibration data; and
reconstruct an image from the image data based on the point-spread function.

16. The system according to claim 15, wherein the imaging scan is configured such that a central region of k-space has uniform sampling, the controller being configured to extract a uniformly-sampled central region of k-space to generate the calibration data.

17. The system according to claim 15, wherein the imaging scan is configured such that at least a portion of k-space has non-uniform sampling.

18. The system according to claim 15, wherein the controller is further configured to control the MR scanner to perform a calibration scan to determine the calibration data.

19. The system according to claim 18, wherein k-space corresponding to the calibration data includes a central region having uniform sampling.

20. The system according to claim 18, wherein the calibration scan has a lower spatial resolution than the imaging scan.

* * * * *